United States Patent
Acton et al.

(10) Patent No.: US 11,476,334 B2
(45) Date of Patent: Oct. 18, 2022

(54) SILICIDE STRUCTURE OF AN INTEGRATED TRANSISTOR DEVICE AND METHOD OF PROVIDING SAME

(71) Applicant: Intel Corporation, Santa Clara, CA (US)

(72) Inventors: Orb Acton, Portland, OR (US); Joseph Steigerwald, Forest Grove, OR (US); Anand Murthy, Portland, OR (US); Scott Maddox, Austin, TX (US); Jenny Hu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 75 days.

(21) Appl. No.: 16/957,055

(22) PCT Filed: Feb. 8, 2018

(86) PCT No.: PCT/US2018/017411
§ 371 (c)(1),
(2) Date: Jun. 22, 2020

(87) PCT Pub. No.: WO2019/156673
PCT Pub. Date: Aug. 15, 2019

(65) Prior Publication Data
US 2020/0343343 A1 Oct. 29, 2020

(51) Int. Cl.
*H01L 29/10* (2006.01)
*H01L 21/28* (2006.01)
(Continued)

(52) U.S. Cl.
CPC .... *H01L 29/1054* (2013.01); *H01L 21/28097* (2013.01); *H01L 29/41791* (2013.01);
(Continued)

(58) Field of Classification Search
None
See application file for complete search history.

(56) References Cited

U.S. PATENT DOCUMENTS

| 7,795,682 B2 | 9/2010 | Kaneko et al. |
| 7,883,972 B2 * | 2/2011 | Yoon .............. H01L 29/66795 |
| | | 257/E21.422 |

(Continued)

FOREIGN PATENT DOCUMENTS

| JP | 2007123867 | 5/2007 |
| JP | 2007207837 | 8/2007 |
| JP | 2017526174 | 9/2017 |

OTHER PUBLICATIONS

International Preliminary Report on Patentability from PCT/US2018/017411 dated Aug. 20, 2020, 10 pgs.
(Continued)

*Primary Examiner* — Khaja Ahmad
(74) *Attorney, Agent, or Firm* — Essential Patents Group, LLP

(57) ABSTRACT

Techniques and mechanisms for providing functionality of a transistor which comprises a conformal layer of a gate work function silicide. In an embodiment, the transistor comprises a channel region and a gate dielectric which extends and adjoins the channel region. The gate dielectric also adjoins a layer structure of the transistor, the layer structure comprising a silicide. The silicide includes silicon and a component D which comprises a non-metal element from one of Groups IIIa, IVa, or Va. In another embodiment, the silicide further comprises a component M which includes a transition metal element from one of Groups IVb, Vb, VIb, VIIB, or VIIIb and/or which includes a metal element from one of Groups IIIa, IVa, or Va.

13 Claims, 10 Drawing Sheets

(51) Int. Cl.
    *H01L 29/417*     (2006.01)
    *H01L 29/49*     (2006.01)
    *H01L 29/66*     (2006.01)
    *H01L 29/78*     (2006.01)

(52) U.S. Cl.
    CPC ...... *H01L 29/4933* (2013.01); *H01L 29/4975* (2013.01); *H01L 29/66795* (2013.01); *H01L 29/785* (2013.01)

(56) References Cited

U.S. PATENT DOCUMENTS

| | | | |
|---|---|---|---|
| 8,188,551 | B2 | 5/2012 | Schulz et al. |
| 9,972,541 | B2 | 5/2018 | Steigerwald et al. |
| 10,181,426 | B1 * | 1/2019 | Ching ............... H01L 29/42368 |
| 2005/0051825 | A1 * | 3/2005 | Fujiwara ........... H01L 29/66818 |
| | | | 257/E29.147 |
| 2006/0124974 | A1 | 6/2006 | Cabral, Jr. |
| 2009/0039439 | A1 | 2/2009 | Ramin et al. |
| 2012/0248545 | A1 | 10/2012 | Yugami |
| 2013/0049092 | A1 | 2/2013 | Liang et al. |
| 2014/0264483 | A1 * | 9/2014 | Yoshida ............ H01L 21/28079 |
| | | | 257/288 |
| 2015/0248044 | A1 * | 9/2015 | Kimura ................ G09G 3/3659 |
| | | | 349/47 |
| 2016/0225764 | A1 * | 8/2016 | Chang ................... H01L 29/495 |
| 2016/0276160 | A1 | 9/2016 | Ching et al. |

OTHER PUBLICATIONS

International Search Report & Written Opinion dated Nov. 14, 2018 for PCT Patent Application No. PCT/US2018/017411.
Office Action from Japanese Patent Application No. 2020-532012 dated Feb. 1, 2022, 8 pgs.

\* cited by examiner

SILICIDE STRUCTURE OF AN INTEGRATED TRANSISTOR DEVICE AND METHOD OF PROVIDING SAME

CLAIM OF PRIORITY

This Application is a National Stage Entry of, and claims priority to, PCT Application No. PCT/US2018/017411, filed on Feb. 8, 2018 and titled "SILICIDE STRUCTURE OF AN INTEGRATED TRANSISTOR DEVICE AND METHOD OF PROVIDING SAME", which is incorporated by reference in its entirety for all purposes.

BACKGROUND

Embodiments of the invention relate generally to semiconductor technology and more particularly, but not exclusively, to silicide structures of transistors.

In semiconductor processing, transistors are typically formed on semiconductor wafers. In CMOS (complimentary metal oxide semiconductor) technology, transistors usually belong to one of two types: NMOS (negative channel metal oxide semiconductor) or PMOS (positive channel metal oxide semiconductor) transistors. The transistors and other devices may be interconnected to form integrated circuits (ICs) which perform numerous useful functions.

Operation of such ICs depends at least in part on the performance of the transistors which, in turn, are susceptible to the effects of process variation. Such process variation—which can affect compliance with strict requirements regarding threshold voltage, resistivity and/or other performance characteristics—is expected to increasingly constrain the further scaling of next-generation semiconductor fabrication techniques.

A FinFET is a transistor built around a thin strip of semiconductor material (generally referred to as the fin). The transistor includes the standard field effect transistor (FET) nodes, including a gate, a gate dielectric, a source region, and a drain region. The conductive channel of such a device resides on the outer sides of the fin beneath the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a trigate FinFET. Other types of FinFET configurations are also available, such as so-called double-gate FinFETs, in which the conductive channel principally resides only along the two sidewalls of the fin (and not along the top of the fin). There are a number of non-trivial issues associated with fabricating such fin-based transistors.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
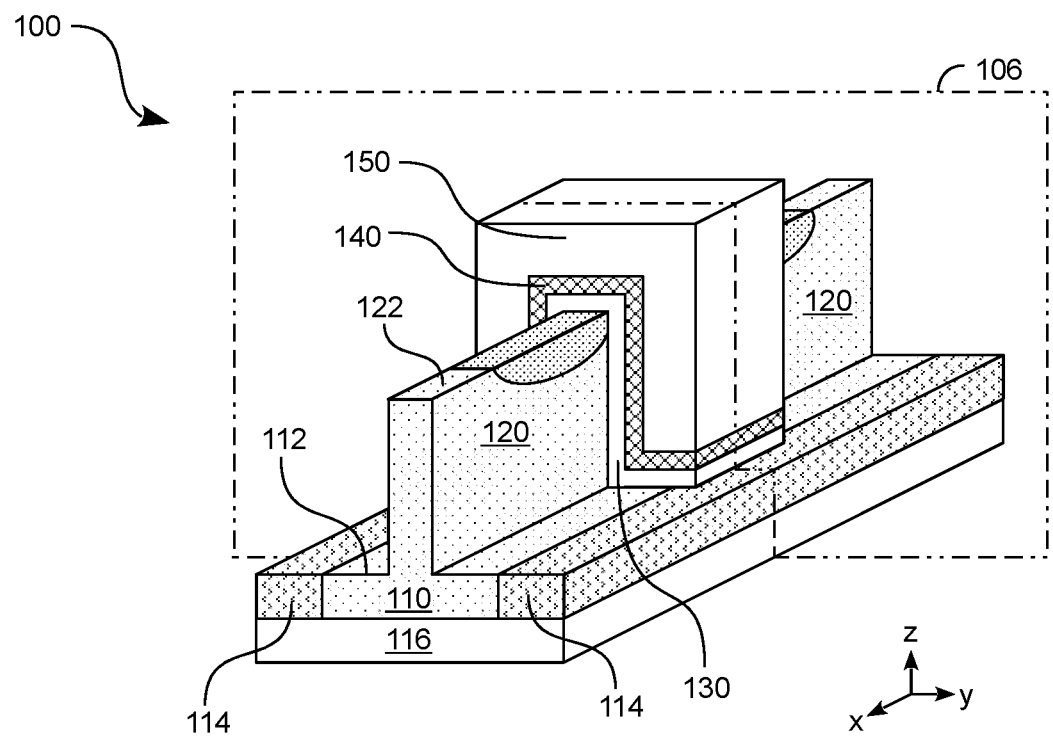
FIG. 1 shows various views illustrating elements of a transistor structure including a silicide gate structure according to an embodiment.
Figure 1:
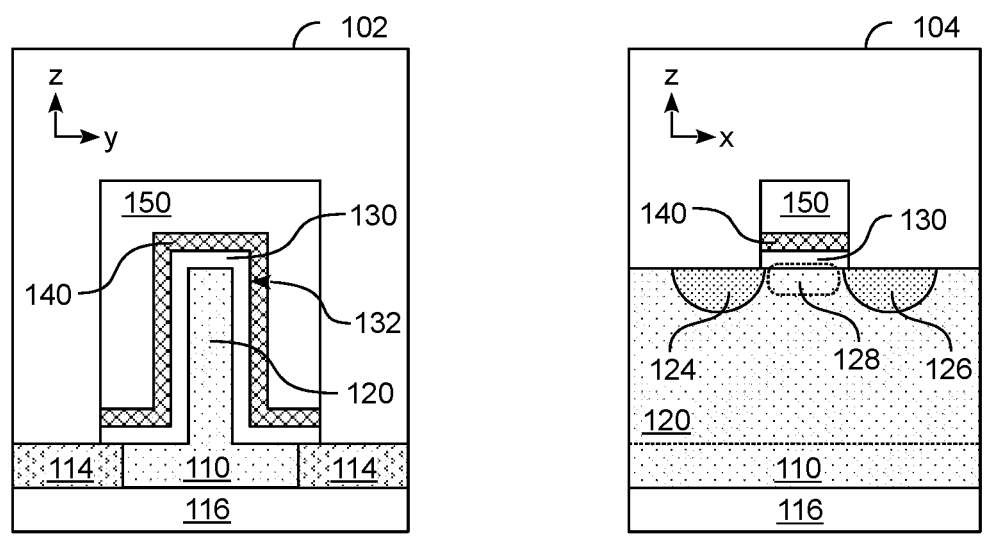

Embodiments discussed herein variously provide techniques and mechanisms wherein a transistor structure (for brevity, also referred to herein simply as "transistor") is to include a silicide structure which contributes to one or more work function characteristics. For example, the transistor may include a channel region—disposed between a doped source region and a doped drain region—and a gate dielectric structure which extends along, and adjoins, at least a portion of a side of the channel region. The gate dielectric structure may include a layer which comprises a dielectric material to insulate the channel region from one or more gate structures of the transistor. In such an embodiment, the one or more gate structures may include a second layer which comprises a silicide. At least a portion of this second layer may adjoin and substantially conform to at least a portion of the gate dielectric structure—e.g., wherein the second layer and the channel region are on opposite sides of the gate dielectric structure.

Currently, various metals (referred to as gate work function metals) are used to facilitate, at least in part, desired band gap and/or other performance characteristics of a transistor. Various titanium-aluminum-carbide (TiAlC) composite metals, for example, are used as such gate work function metals. Many of these gate work function metals tend to result in a threshold voltage ($V_{th}$) being somewhat high, at least for use in next-generation technologies which are smaller scale and/or more power efficient. For example, threshold voltages may be unacceptable high in cases where a thin film of a TiAlC metal is under a few nanometers (nm) in thickness. Other problems associated with various gate work function metals include degradation due to subsequent fabrication processing at higher temperatures, poorer conductivity characteristics as films thicknesses decrease, and sensitivity to metal compositions being non-homogenous (e.g., across a given thin film and/or between different thin films). As a result, some common gate work function metals are unfeasible for use in various current or upcoming sub-10 nm technologies.

Some embodiments are based on a realization by the inventors that, as compared to traditional gate work function metals (including metal compounds), various silicide compounds enable lower threshold voltages—e.g., even where a silicide thin film is under a few nanometers in thickness. Furthermore, these silicide compounds may be relatively more tolerant of large thermal changes that often take place during later fabrication processing. Further still, silicide compounds in various embodiments may additionally or alternatively provide relatively high conductivity and low RC delay.

Certain features of various embodiments are described herein with reference to a transistor, such as a FinFET device, which comprises a first layer, a second layer, and a fin structure, wherein the first layer is disposed between the second layer and the fin structure, and wherein the first layer and the second layer comprise, respectively, a dielectric material and a silicide. Some embodiments are described herein with more particularly reference to structures of an N-type metal-oxide (NMOS) transistor. However, such description may be extended to additionally or alternatively pertain to any of a variety of other transistors which include a channel region and a gate dielectric structure which is disposed between (and which, for example, adjoins each of) the channel region and a gate work function layer including a silicide.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including integrated circuitry comprising a transistor which includes a work function silicide structure.

FIG. 1 shows, in a perspective view, some features of an integrated circuit (IC) device 100 including a silicide structure to facilitate threshold voltage, conductivity, and/or other performance characteristics of a transistor according to an embodiment. FIG. 1 also shows cross-sectional side views 102, 104 of IC device 100 in the y-z plane and the x-z plane (respectively) of the xyz coordinate system shown.

IC device 100 is one example of an embodiment wherein a transistor (e.g., an NMOS transistor) includes a doped source region and a doped drain region on opposite respective sides of a channel region. A gate dielectric may extend over a surface portion of the channel region, wherein another layer—including a silicide—extends along at least a portion of the gate dielectric. Such a transistor may include doped source or drain regions of a fin structure, where structures—e.g., including the gate dielectric, the silicide and a gate electrode—extend over the fin structure. The fin structure may be formed by a first semiconductor body which is disposed on a second semiconductor body (referred to herein as a "buffer layer") that—for example—may facilitate an imposition of a tensile stress on the NMOS transistor. In some embodiments, a material of the fin structure is the same as, and contiguous with, that of at least a top portion of the buffer layer. In other embodiments, the channel structure is that of a planar transistor other than any fin-type transistor.

In the example embodiment shown, IC device 100 includes a buffer layer 110 having a side 112. Buffer layer 110 may comprise one or more epitaxial single crystalline semiconductor layers (e.g., silicon, germanium, silicon germanium, gallium arsenide, indium phosphide, indium gallium arsenide, aluminum gallium arsenide, etc.) which—for example—may be grown atop a different bulk semiconductor substrate (such as the illustrative silicon substrate 116 shown).

Although some embodiments are not limited in this regard, buffer layer 110 may comprise various epitaxially grown semiconductor sub-layers which, for example, have different lattice constants. Such semiconductor sub-layers may serve to grade the lattice constant along the z-axis of the xyz coordinate system shown. For example, a germanium concentration of the SiGe buffer layer 110 may increase from 30% germanium at the bottom-most buffer layer to 70% germanium at the top-most buffer layer, thereby gradually increasing the lattice constant.

IC device 100 may further include on buffer layer 110 a first semiconductor body which forms a fin structure (such as the illustrative fin structure 120 shown). For example, the first semiconductor body may be formed in part from an epitaxially grown single crystalline semiconductor such as, but not limited to Si, Ge, GeSn, SiGe, GaAs, InSb, GaP, GaSb, InAlAs, InGaAs, GaSbP, GaAsSb, GaN, GaP, and InP. Fin structure 120 may extend to side 112, in some embodiments. In other embodiments, the first semiconductor body may further comprise an underlying sublayer portion from which fin structure 120 extends (e.g., where the underlying sublayer portion is disposed between, and adjoins each of, side 112 and fin structure 120).

As used herein, "source or drain region" (or alternatively, "source/drain region") refers to a structure which is configured to function as one of a source of a transistor or a drain of a transistor. Doped portions of fin structure 120 may provide a source of an NMOS transistor and a drain of the NMOS transistor (such as the illustrative source/drain regions 124, 126 shown). A channel region 128 of the NMOS transistor may be disposed between source/drain regions 124, 126, wherein a gate dielectric 130 extends at least in part along, and adjoins, one or more sides of fin structure 120. In the example embodiment shown, gate dielectric 130 comprises a layer of dielectric material which extends over a top side 122 of fin structure 120. Such a layer of dielectric material may further extend along either or both of two opposing vertical sidewalls of fin structure 120—e.g., wherein gate dielectric 130 extends to side 112.

To provide work function characteristics of a transistor gate, IC device 100 may further comprise a layer 140—comprising a silicide—that extends at least in part along a portion of the gate dielectric 130. Channel region 128 may include any of a variety of semiconductor materials which, for example, are adapted from conventional NMOS (or other) transistor designs. Some examples of such semiconductor materials include, but are not limited to, silicon (Si), germanium (Ge), silicon-germanium (SiGe), and any of a variety of suitable III-V semiconductor materials such as various InAs materials, InGaAs materials, GaAs materials, InP materials or the like. The particular silicide which is to be included in layer 140 according to some embodiments may accommodate operation with a particular semiconductor material of channel region 128—e.g., wherein a work function to be provided by that silicide facilitates a desired threshold voltage with the semiconductor material of the channel region 128. The particular combination of such a channel material and a silicide may depend on implementation-specific details, and may not be limiting on some embodiments.

In some embodiments, layer 140 comprises a silicide that, for example, may be represented as $M_xSi_yD_z$, wherein the silicide comprises—in stoichiometric proportions x, y and z—silicon (Si), a component D and another component M. $M_xSi_yD_z$ silicide formulations may provide an advantageously low threshold voltage (Vt) for NMOS transistor embodiments that have a silicon channel. As used herein with reference to the composition of a silicide, "component" refers to an element of compound which has been or is to be included, in some form, as part of a silicide. It is to be noted that the labels "x," "x1," "x2," "y" and/or "z" are variously used herein to represent stoichiometric proportions of a given silicide. However, the meaning of such labels with respect to one silicide described herein is to be distinguished from, and may not be limiting on, the meaning of such labels with respect to another silicide described herein.

Component D may include any of a variety of elements or compounds that are chemically able to form a solid with silicon. By way of illustration and not limitation, component D may include one or more elements each from a respective one of Groups IIIa, IVa, or Va (e.g., wherein the one or more elements are non-metal elements). In some embodiments, deposition to form a first material (e.g., $Si_yD_z$) is performed using one or more Si precursors, such as, silane, disilane, trisilane, tetrasilane and dichlorosilane. Component M may include of a variety of metal elements that are chemically able to form a solid with a material (e.g., $Si_yD_z$) which includes silicon and component D. By way of illustration and not limitation, component M may include one or more transition metal elements each from a respective one of Group IVb, Vb, VIb, VIIB, or VIIIb. Alternatively or in addition, component M may include one or more metal elements each from a respective one of Groups IIIa, IVa, or Va. In some embodiments, component M is a compound which includes both a metal M1 and another metal M2 which is of a different metal type than that of metal M1. For example, metal M1 may be an element from one of Groups IIIa, IVa, Va, IVb, Vb, VIb, VIIB, or VIIIb—e.g., where metal M2 is a different element from another one of (or alternatively, from the same one of) Groups IIIa, IVa, Va, IVb, Vb, VIb, VIIB, or VIIIb. In some embodiments, one or more metals of component M (e.g., including one or each of two different metals M1, M2) may each be a respective one of Al, Ga, Hf, In, Nb, Os, Ru, Ta, Ti, W, Y, or Zr—e.g., wherein component D includes one of As, Ga, Ge, N, P or Sb. In other embodiments, component D omits any metal element. Some specific examples of gate work function silicides which include silicon, a component M and a component D, are $Ta_xSi_yP_z$, $Ti_xSi_yGe_z$, $Ta_{x1}Al_{x2}Si_y$, $Ta_{x1}Ti_{x2}Si_y$, $Hf_{x1}Ga_{x2}Si_ySb_z$, $Ti_{x1}Al_{x2}Si_yGe_z$, or $W_{x1}Y_{x2}Si_yAs_z$. In other embodiments, a gate work function silicide comprises silicon and a component M, but omits any component D—e.g., wherein the aluminum (Al), hafnium (Hf), tantalum (Ta), titanium (Ti), or tungsten (W). For example, such a silicide may comprise $Al_xSi_y$, $Hf_xSi_y$, $Ta_xSi_y$, $Ti_xSi_y$, or $W_xSi_y$.

The silicide of layer 140 may substantially conform to a curved or angled surface over which layer 140 extends (and which layer 140 adjoins, for example). As used herein, "substantially conforms," "substantially conformal," etc. variously refer to a conformality of a layer, wherein at least a first portion of the layer extends over a curved and/or angled portion of a surface, wherein the first portion has a minimum thickness, and wherein any variation of the thickness of the first portion from that minimum thickness is less than one half of that minimum thickness. For example, any such variation of the thickness may be less than one fourth (25%) of the minimum thickness and, in some embodiments, less than one fifth (20%) of the minimum thickness.

The minimum thickness of a silicide layer (such as layer 140) may be equal to or less than 20 nm—e.g., wherein the minimum thickness is equal to or less than 10 nm and, in some embodiments, equal to or less than 7 nm. Alternatively or in addition, the curved and/or angled portion of the surface may span a distance (e.g., a z-axis or "vertical" distance) which is at least three times the minimum thickness of the first portion of the layer. Such conformality may be a result of operations to form a silicide—e.g., wherein such operations include a self-aligning process and/or a two-part deposition and reaction process as described herein. In the example embodiment shown, layer 140 extends along at least a portion of a surface 132 of gate dielectric 130—e.g., where layer 140 is disposed over gate dielectric 130 on side 122 and where layer 140 also extends (in some embodiment) along vertical sidewalls gate dielectric 130 which are on opposite sides of fin structure 120. Layer 140 may be conformal insofar as a top side of layer 140 and a bottom side of layer 140 both curve or angle in the same direction with a corresponding curve or angle of surface 132 (or some other surface) over which layer 140 extends. The particular shape of surface 132 is merely illustrative, and layer 140 may conform to any of a variety of one or more additional or alternative curves and/or angles, in other embodiments.

One or more additional gate structures of the transistor (e.g., including the illustrative gate electrode 150 shown) may extend over a portion of fin structure 120 which includes the channel region 128. For example, source/drain regions 124, 126 regions may extend to—and in some embodiments, under—laterally opposite sides of gate electrode 150. In other embodiments, gate structures of the transistor additionally or alternatively comprise one or more other work function metals which, for example, are stacked on layer 140 and under a gate electrode material such as that of gate electrode 150.

Source/drain regions 124, 126 and the channel region 128 may be configured to conduct current during operation of IC device 100—e.g., the current controlled using gate electrode 150. For example, source/drain regions 124, 126 may be disposed in a source/drain well which is formed with fin structure 120. One or both of source/drain regions 124, 126 may comprise a SiGe compound—e.g., wherein other portions of fin structure 120 have a different compound than the SiGe compound. Source/drain regions 124, 126 may include any of a variety of suitable n-type dopants, such as one of phosphorus or arsenic.

Structures of buffer layer 110 and/or structures of fin structure 120 may be electrically isolated at least in part, by insulation structures 114 (for example), from other circuit structures of IC device 100. Insulation structures 114 may include silicon dioxide or any of a variety of other dielectric materials adapted, for example, from conventional isolation techniques. The sizes, shapes, number and relative configuration of insulation structures 114 are merely illustrative, and IC device 100 may include any of a variety of additional or alternative insulation structures, in other embodiments.

Gate dielectric 130 may include a high-k gate dielectric, such as hafnium oxide. In various other embodiments, gate dielectric 130 may include hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide aluminum oxide, lead scandium tantalum oxide, or lead zinc niobate. In another embodiment, gate dielectric 130 includes silicon dioxide.

Gate electrode 150 may be formed of any suitable gate electrode material. In an embodiment, gate electrode 150 comprises a doped polycrystalline silicon. Alternatively or in addition, gate electrode 150 may comprise a metal material, such as but not limited to tungsten, tantalum, titanium and their nitrides. It is to be appreciated that gate electrode 150 need not necessarily be a single material and may be a composite stack of thin films, such as but not limited to a polycrystalline silicon/metal electrode or a metal/polycrystalline silicon electrode.

The transistor may further comprise dielectric sidewall spacers (not shown) which each extend along a respective one of these laterally opposite sides of gate electrode 150—e.g., wherein such sidewall spacers comprise silicon nitride, silicon oxide, silicon oxynitride or combinations thereof. The respective thickness of such sidewall spacers may facilitate isolation of layer 140 and/or gate electrode 150 during processes to form source/drain regions 124, 126.

Although some embodiments are not limited in this regard, the NMOS transistor may include multiple distinct channel regions each between source/drain regions 124, 126—e.g., the multiple channel regions including one or more nanowire structures. Such one or more nanowires may, for example, be formed of any of various suitable materials such as, but not limited to Si, Ge, SiGe, GaAs, InSb, GaP, GaSb, InAlAs, InGaAs, GaSbP, GaAsSb, InP, and carbon nanotubes.

In an embodiment, the first semiconductor body which forms fin structure 120 may have a crystalline structure other than that of the adjoining buffer layer 110. A mismatch (e.g., the lattice constant mismatch) between fin structure 120 and side 112 may result in a tensile stress being imposed in a channel region 128 which is between source/drain regions 124, 126. For example, a lattice constant of side 112 may be different from the lattice constant of fin structure 120. In one such embodiment, one of side 112 and fin structure 120 comprises silicon germanium having a first silicon-to-germanium component ratio, where the other of side 112 and fin structure 120 comprises pure silicon or silicon germanium having a second silicon-to-germanium component ratio other than the first silicon-to-germanium component ratio. However, any of various other lattice mismatches may be provided with buffer layer 110 and fin structure 120, in different embodiments.

Figure 2:
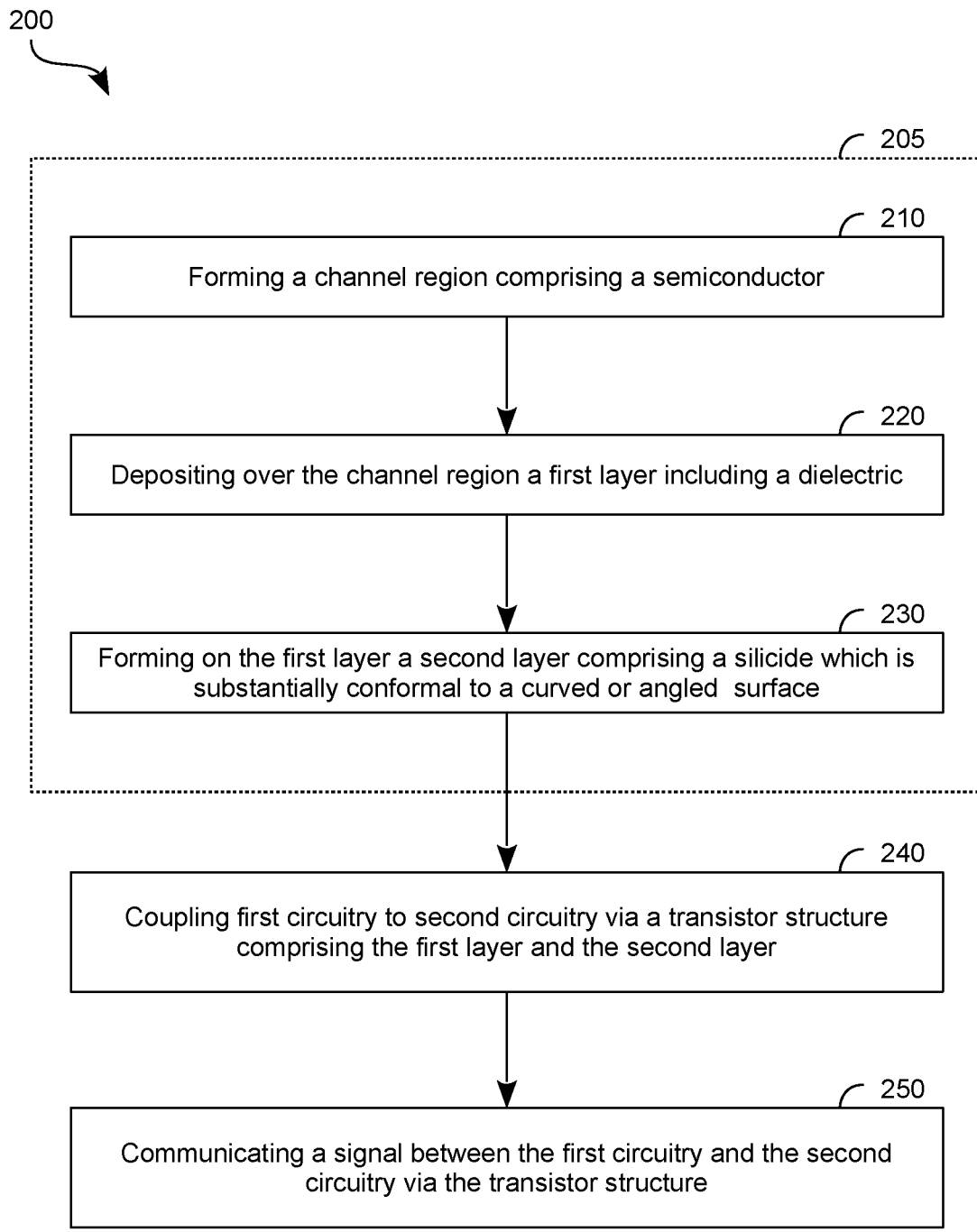
FIG. 2 is a flow diagram illustrating elements of a method for providing functionality of a transistor structure according to an embodiment.

FIG. 2 shows features of a method 200, according to an embodiment, to provide functionality of a transistor structure (i.e., a structure configured to provide transistor functionality) which includes a work function silicide. Method 200 may include processes to fabricate, interconnect and/or operate structures such as those of IC device 100, for example. To illustrate certain features of various embodiments, method 200 is described herein with reference to structures shown in FIGS. 3A through 3D. However, any of a variety of additional or alternative structures may be fabricated according to method 200, in different embodiments.

As shown in FIG. 2, method 200 may comprise operations 205 to fabricate a transistor structure at least in part. Such operations 205 may including forming a channel region (i.e., a region which is to function as a channel during operation of the transistor structure), forming a first layer comprising a dielectric, and forming a second layer comprising a silicide. A portion of the first layer may be disposed between, and variously adjoin, each of the channel region and the second layer—e.g., wherein the first layer is to provide a gate dielectric of the transistor structure and wherein the second layer is to provide a gate work function silicide of the transistor structure.

By way of illustration and not limitation, operations 205 may include (at 210) forming a channel region comprising a semiconductor and (at 220) depositing over the fin structure a first layer including a dielectric material. A minimum thickness of the first layer may be equal to or less than 3 nm (e.g., 2 nm or less). In one embodiment, the minimum thickness of the first layer is in a range of 5 Angstrom (A) to 40 Å. However, such dimensions may vary according to implementation-specific details, in different embodiments.

The first layer may serve as a gate dielectric which is to provide at least some electrical insulation between the channel region of a transistor structure and one or more gate structures of the transistor structure. For example, operations 205 may also subsequently process a fin structure (or in the case of a planar transistor, a semiconductor substrate region) to provide therein two source or drain regions, where at least one channel region is disposed therebetween. Formation of the channel region at 210 and/or depositing the first layer at 220 may include one or more processes which are adapted from conventional semiconductor fabrication techniques. Such techniques may include, for example, any of a variety of additive processes (such as chemical vapor deposition, atomic layer deposition or the like) and/or subtractive processes (such as patterned masking, photolithography, wet etching, plasma etching, etc.).

Figure 3A:
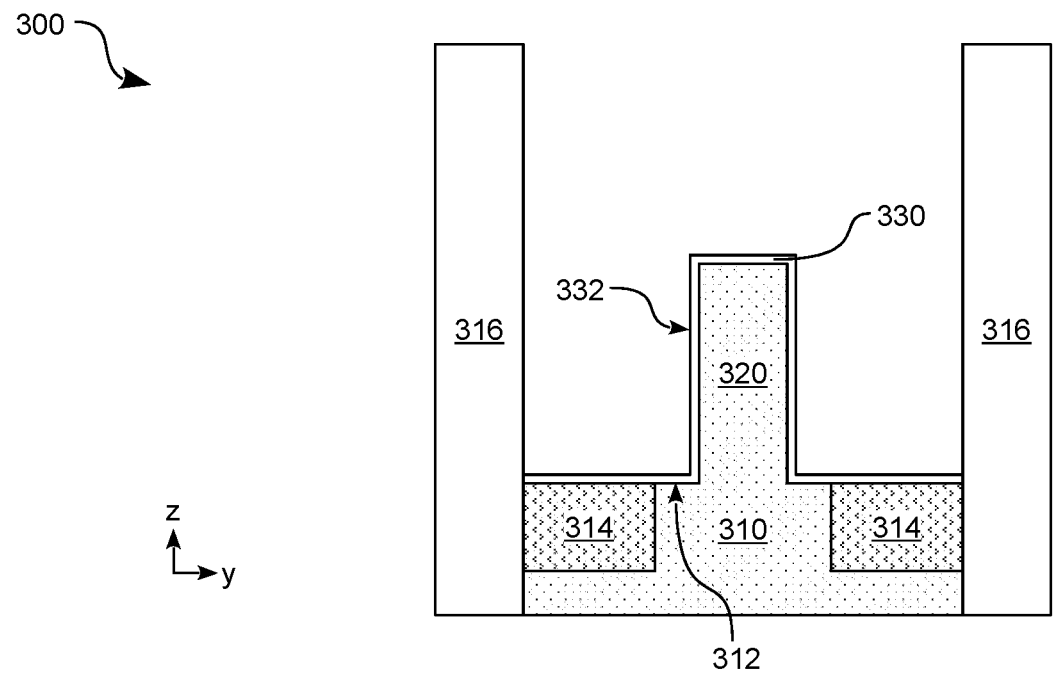
FIGS. 3A through 3D show various views each illustrating structures at a respective stage of processing to provide work function characteristics with a transistor structure according to an embodiment.
Figure 3A:
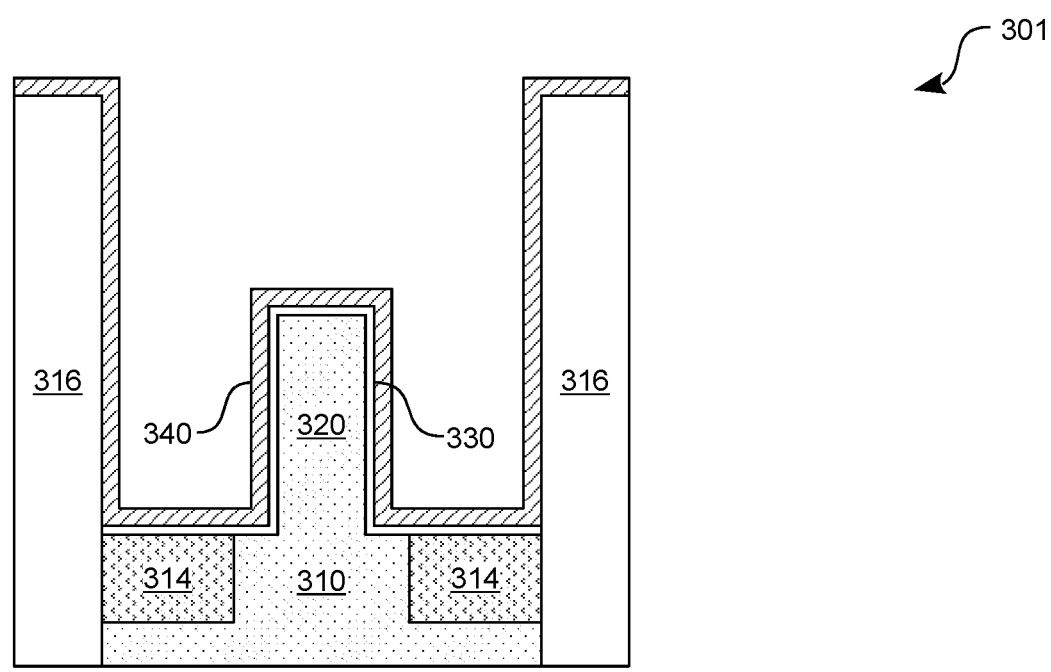
Figure 3B:
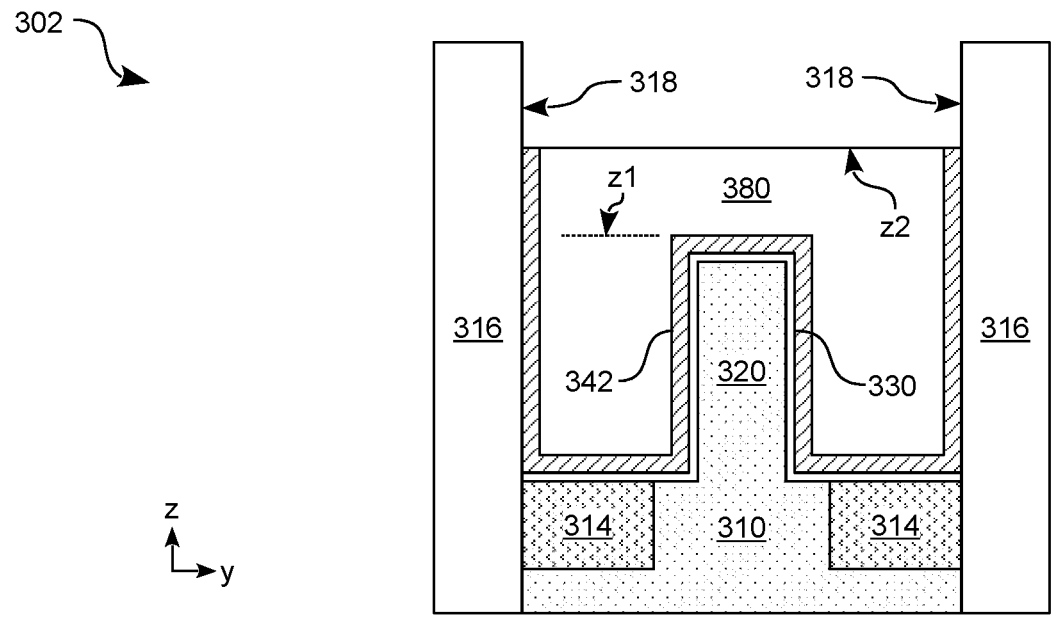
Figure 3B:
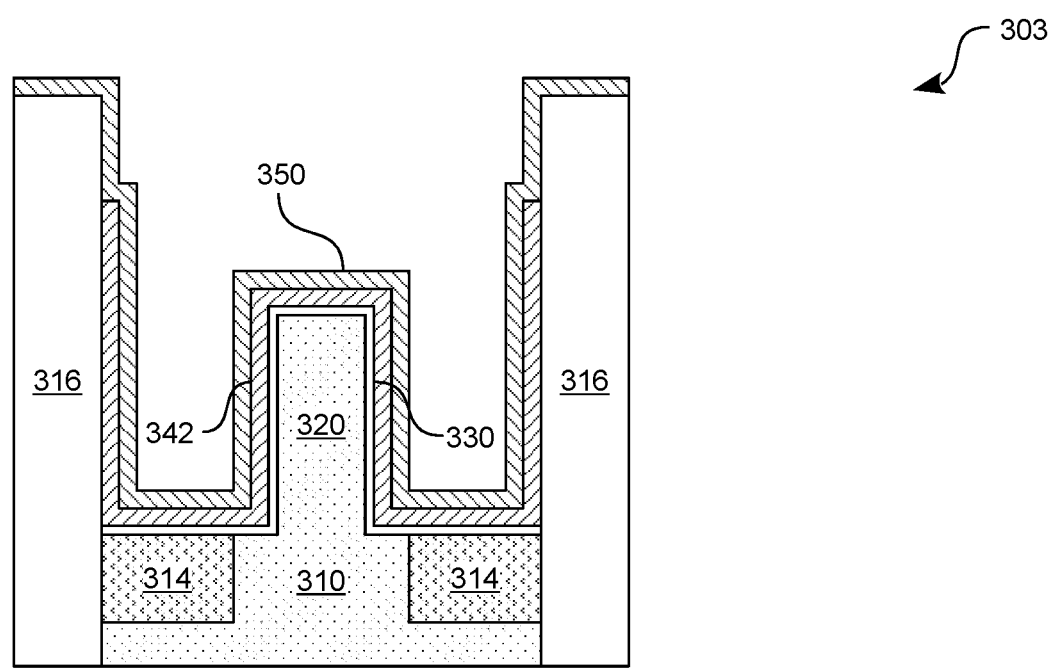
Figure 3C:
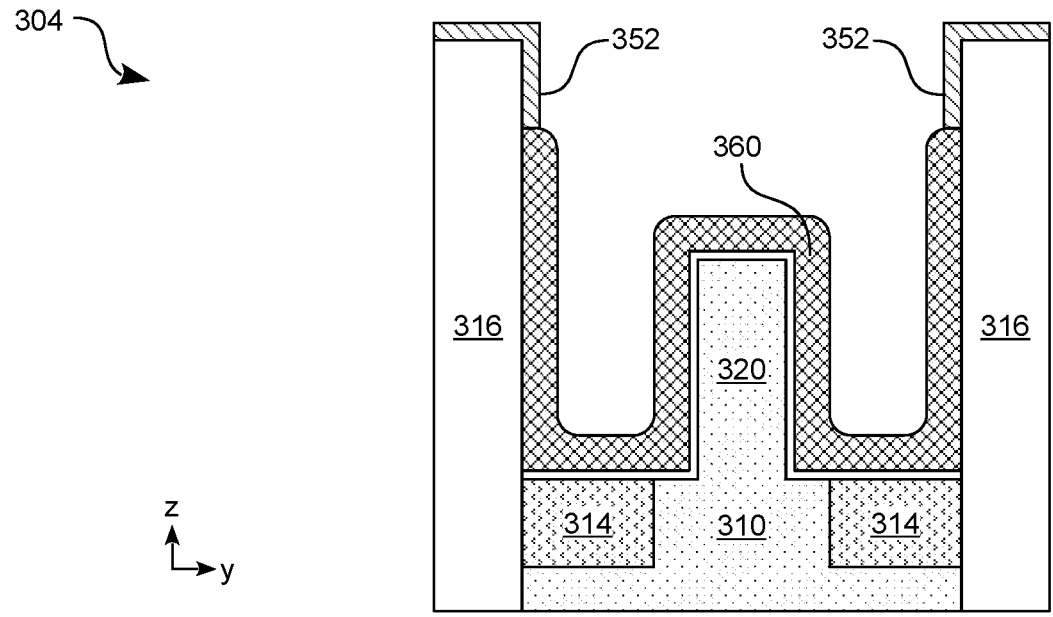
Figure 3C:
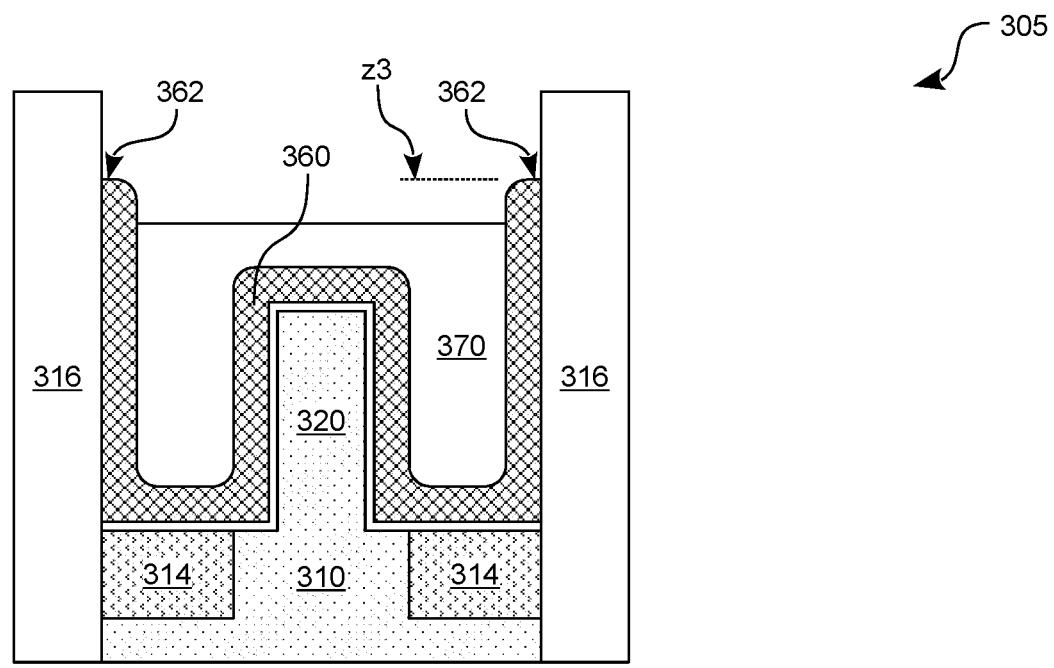

The channel region formed at 210 may be disposed in a first fin structure which is to be part of the transistor structure—e.g., wherein the method further comprises forming a second fin structure (for the same transistor structure or a different transistor structure) which is also disposed on the buffer layer. Referring now to FIGS. 3A through 3C, cross-sectional views are shown for respective stages 300-305 of processing to fabricate a transistor structure according to an embodiment. The cross-sectional views shown in FIGS. 3A through 3C correspond to a cross-sectional plane such as the y-z plane 106 shown in FIG. 1. As shown at stage 300, one or more fin structures (such as the illustrative fin structure 320 shown) may be disposed directly or indirectly on a side 312 of a buffer layer 310—e.g., where fin structure 320 and buffer layer 310 correspond functionally to fin structure 120 and buffer layer 110, respectively. Insulation structures 314 (such as insulation structures 114), may enable at least some electrical isolation of buffer layer 310 and fin structure 320. Although fin structure 320 is shown having a rectilinear cross-sectional profile, in other embodiments one or more sides, corners and/or edges of a given fin structure may form any of a variety of tapered, curved and/or otherwise non-rectilinear shapes. In one example embodiment, a height (z-axis dimension) of fin structure 320 is in a range of 10 nm to 200 nm. However, such dimensions may vary according to implementation-specific details, in different embodiments.

Prior to or at stage 300, a layer 330 including a dielectric material may be formed (e.g., at 220) to extend at least partially around fin structure 320. In some embodiments, one or more other insulators, patterned masks and/or other structures may be formed prior to or at stage 300. Examples of such other structures are represented at stage 300 by the illustrative structures 316 shown. One or each of structures 316 may include various respective sub-structures—e.g., wherein a portion of layer 330 extends into, and forms in part, one or both of structures 316. During subsequent processing of stages 301-305, selective etching may be performed to prevent the formation of a silicide on at least a portion of such structures 316. Fin structure 320, dielectric layer 330 and/or other structures—such as structures 316—may be formed during stages 300-305 using one or more operations which, for example, are adapted from conventional semiconductor fabrication techniques—e.g., including mask, lithography, deposition (e.g., chemical vapor deposition), etching and/or other processes. Some of these conventional techniques are not detailed herein to avoid obscuring certain features of various embodiments.

Method 200 may further comprise (at 230) forming, on the first layer, a second layer comprising a silicide, wherein second layer is substantially conformal to a curved or angled surface over which the second layer extends. By way of illustration and not limitation, a first portion of layer 140 may extend at least along a vertical or otherwise angled sidewall of surface 132 (e.g., wherein the first portion also extends to a local minimum of surface 132 near a bottom of fin structure 120 and/or to a local maximum of surface 132 above fin structure 120). In such an embodiment, a z-axis span of the first portion may be at least three times the minimum thickness of the first portion—e.g., wherein the z-axis span is at least five times (and in some embodiments, at least eight times) the minimum thickness. Any variation of the thickness of the first portion from the minimum thickness may be less than one half of the minimum thickness—e.g., wherein a maximum thickness variation is equal to or less than one third (and in some embodiments, equal to or less than one fifth) of the minimum thickness.

For example, a first portion of layer 140 may extend both along a bottom 10% of the vertical span of fin structure 120, and along a top 10% of the vertical span of fin structure 120. In such an embodiment, any variation in minimum thickness from the minimum thickness of that first portion may be less than one half (e.g., less than one third) of that minimum thickness. For example, any such variation may be less than one fifth (and in some embodiments, less than one eighth) of the minimum thickness. In one example embodiment, a minimum thickness of second layer is equal to or less than 20 nm. In such an embodiment, the maximum of any variation of the minimum thickness of the first portion may be less than 10 nm.

The silicide of the second layer may comprise silicon, a component M (which comprises one or more metal elements), and—in some embodiments—a component D. The component D may include one or more elements each from a respective one of Groups IIIa, IVa, or Va. Alternatively or in addition, the component M may include a transition metal element from one of Group IVb, Vb, VIb, VIIB, or VIIIb, and/or may include a metal element from a one of Groups IIIa, IVa, or Va. For example, component M may comprise at least two metals M1, M2 each of a different respective metal type. In one embodiment, metal M1 is an element from one of Groups IIIa, IVa, Va, IVb, Vb, VIb, VIIB, or VIIIb—e.g., where metal M2 is a different element from another one of (or alternatively, from the same one of) Groups IIIa, IVa, Va, IVb, Vb, VIb, VIIB, or VIIIb. After the forming at 230, a portion of the first layer may be disposed between, and adjoin each of, the channel region and the second layer. A minimum thickness of second layer may be equal to or less than six nanometers—e.g., wherein the minimum thickness of second layer is equal to or less than three nanometers. However, such a thickness dimension may vary according to implementation-specific details, in different embodiments.

The second layer may serve as a work function material which contributes to a threshold voltage of the transistor structure, conductivity characteristics of the transistor structure and/or the like. The second layer may extend along (e.g., over) at least a first side of a fin structure, wherein a portion of the first layer is disposed between a portion of the second layer and a surface portion of the fin structure. For example, the portion of the first layer may adjoin the surface portion of the fin structure, and also adjoin the portion of the second layer. In some embodiments, the first layer may further extend over one or more other sides of the fin structure. For example, a portion of the first layer may extend along a second side of the fin structure—e.g., wherein another portion of the first layer extends along a third side of the fin structure, where the third side is opposite one of the first side and the second side.

As illustrated by stages 301 through 304, formation of the second layer at 230 may include successively depositing different materials which subsequently react with one another to form a silicide. For example, the forming at 230 may comprise depositing a first material on the first layer and, subsequently, depositing a second material on at least a portion of the first layer. One of the first material and the second material may include a component M—e.g., wherein the other of the first material and the second material includes both silicon and a component D. In such an embodiment, forming the second layer at 230 may further comprise reacting respective portions of the first material and the second material to form the silicide. Forming the second layer may, in some embodiments, further comprise etching away a portion of the first material prior to depositing the second material.

By way of illustration and not limitation, as shown at stage 301, a layer 340 including such a first material may be conformally deposited on surface 332 of layer 330—e.g., using atomic layer deposition (ALD), chemical vapor deposition (CVD), rapid thermal chemical vapor deposition (RTCVD) or the like. In one example embodiment, layer 340 includes a compound $Si_yD_z$ comprising silicon and the component D—e.g., wherein layer 340 is deposited conformally to provide a uniform, continuous film having a thickness which, for example, is equal to or less than 3 nm (e.g., 2 nm or less). A minimum thickness of layer 340 may be in a range of 5 Angstrom (Å) to 40 Å, for example.

In some embodiments, one or more portions of layer 340 may be selectively etched or otherwise removed. For example, one or more structures other than fin structure 320—e.g., including at least some portion of structures 316—may be covered with portions of layer 340. Some or all such surface portions of structures 316 may, in some applications, need to be exposed at least at some later stage of fabrication processing. However, etching to expose such surface portions of structures 316 may be impracticable if such etching were to take place after adjoining portions of layer 340 chemically reacted with another material to form silicide structures. Some embodiments prevent a formation of such unwanted silicide structures by providing an etch process to remove portions of layer 340 which are above a top part of fin structure 320.

For example, as shown at stage 302, an etch stop structure 380 (e.g., comprising a carbon hard mask material) may be deposited at least over fin structure 320 and over that portion of layer 340 which extends over fin structure 320. For example, etch stop structure 380 may extend vertically (along the z-axis dimension shown) at least to a height z1 of a portion of layer 340 which extends over fin structure 320—e.g., where etch stop structure 380 further extends to a height z2 which is above height z1. In such an embodiment, etching may subsequently be performed to remove portions of layer 340—e.g., thereby exposing one or more surface regions 318 of structures 316, while leaving a remaining portion 342 of layer 340 on fin structure 320 and dielectric layer 330.

At stage 303, a layer 350 including a second material may be conformally deposited on at least some of the remaining portion 342 of layer 340. Layer 350 (e.g., including a combination of metals M1 and M2) may be deposited—e.g., by ALD, CVD such as plasma-enhanced chemical vapor deposition (PECVD), or other such processing—to make a uniform, conformal, and continuous film which extends over fin structure 320. Layer 350 may be disposed on some or all of remaining portions 342—e.g., wherein a minimum thickness of layer 350 is equal to or less than 3 nm (e.g., 2 nm or less). In one embodiment, the minimum thickness of layer 350 is in a range of 5 Å to 40 Å. In one example embodiment, the second material includes a component M which is to react with the compound $Si_yD_z$ of layer 340. Deposition of component M may facilitate the formation of one or more self-aligned structures. For example, a subsequent reaction between portion 342 with an overlapping portion of layer 350, may result in the formation of a silicide $M_xSi_yD_z$—e.g., a bi-metallic silicide $M1_{x1}M2_{x2}Si_yD_z$—at the variously locations where the compound $Si_yD_z$ of portion 342 is located.

By way of illustration and not limitation, as shown at stage 304, a structure 360 including a silicide may be formed by chemical reaction of portion 342 with adjoining portions of layer 350. A minimum thickness of structure 360 may be equal to or less than 20 nm (in some embodiments, 10 nm or less), for example. In some embodiments, the formation of structure 360 is achieved by reacting portions 342 and adjoining portions of layer 350—e.g., wherein such reacting takes place upon deposition of layer 350 onto portions 342 without or with further processing such as annealing. The resulting structure 360 may be self-aligned based on the sequence of processes which form portion 342 before deposition of layer 350. For example, structure 360 may be delimited at least in part by remaining unreacted portions 352 of layer 350 which did not adjoin portion 342. In such an embodiment, structure 360 may function as at least part of a gate work function silicide layer of a multi-fin transistor, wherein structure 360 conforms to one or more curves and/or one or more angles variously formed, for example, by some or all of surface 332 and respective surfaces of structures 316. Structure 360 may, for example, reside in a lower portion of a recessed region between structures 316—e.g., wherein structure 360 conforms to a bottom surface the lower portion and does not extend above height z2 to an upper edge of the recessed region. The resulting silicide of structure 360 may contribute to performance characteristics which are superior to those of conventional NMOS work function metal (WFM) materials.

Although some embodiments are not limited in this regard, operations 205 may include one or more other processes that fabricate other features of the transistor structure which is to include at least respective portions of the first layer and the second layer. As shown at stage 305, such additional processes may include forming one or more other gate structures 370 on layer 360—e.g., using operations adapted from conventional techniques to fabricate a gate stack, gate electrode or the like. The particular shape and size of such one or more other gate structures 370 is merely illustrative, and not limiting on some embodiments.

Figure 3D:
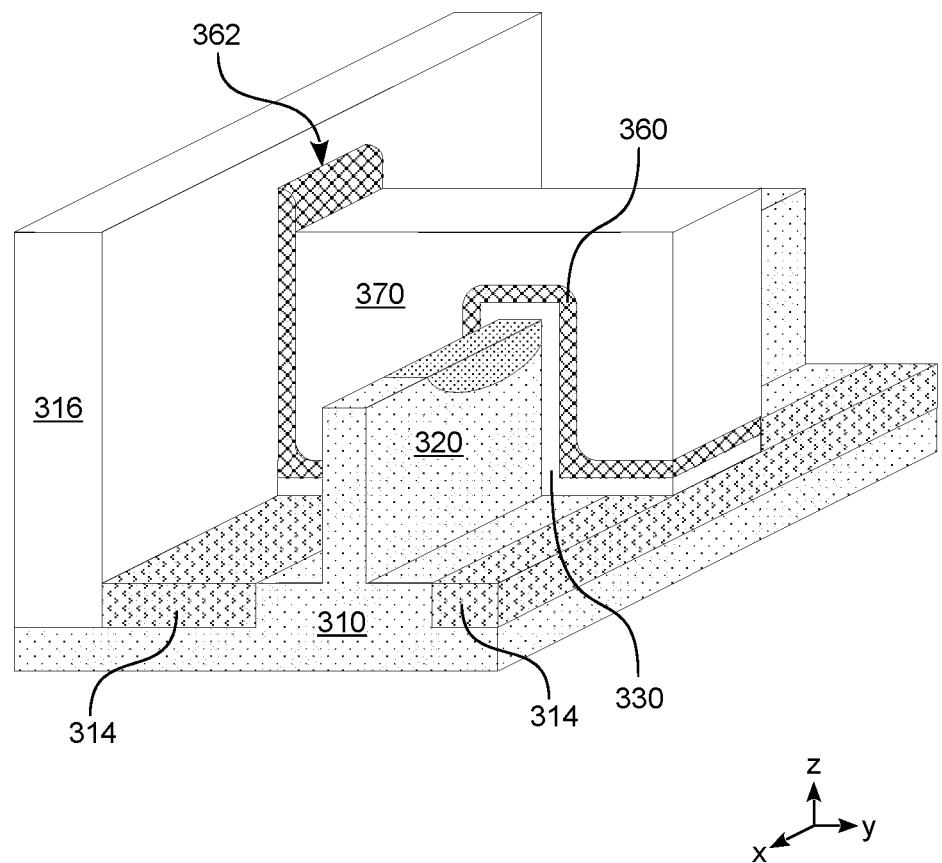

Structure 360 may comprise a substantially conformal layer, wherein one or more edge structures—e.g., including one or both of the illustrative edge structures 362 shown—are formed by a perimeter of the substantially conformal layer. FIG. 3D, which shows a cut-away perspective view of structures at stage 305, illustrates that at least one edge structure 362 may extend—e.g., along a sidewall structure—in parallel with a length (an x-axis dimension) of fin structure 320. Such an edge structure 362 may be offset—both along the y-axis and along the z-axis—from any portion of structure 360 which extends along a sidewall of fin structure 320 or which extends over a width of fin structure 320. For example, a height z3 of such an edge structure 362 may be greater than a height of any portion of structure 360 which is on fin structure 320 or which extends along a sidewall of fin structure 320. In this particular context, "height" refers to a distance, along the z-axis, from some reference height (e.g., that of side 312) which, for example, is at or below the top of fin structure 320. At least some of gate electrode 370 may be disposed in (and in some embodiments, may fill) a recess region which is defined at least in part both by one portion of structure 360, which conforms to a sidewall of fin structure 320, and by another portion of structure 360 which conforms to a sidewall of one of structures 316. In the example embodiment shown, gate electrode 370 extends into two such recess regions, each on opposite respective sides of fin structure 320. In other embodiments, the perimeter of structure 360 may form more, fewer and/or different edge structures which each extend in parallel with a length of fin structure 320 at a respective height above any silicide which extends along or across fin structure 320.

Alternatively or in addition, such additional processes may form source/drain regions each at a respective region of the fin structure, wherein a channel region of the transistor structure is to be disposed between said source/drain regions. By way of illustration and not limitation, one or more recess structures may be wet etched or otherwise formed in fin structure 320. Such one or more recesses may allow for the subsequent deposition therein of a doped SiGe material which is to provide at least part of a source/drain region. For example, a SiGe compound may be epitaxially grown—e.g., by chemical vapor deposition (CVD) or other such additive processes to form at least one SiGe body. The SiGe compound may include a dopant during deposition thereof or, alternatively, may be subsequently doped after using ion implantation, plasma implantation or other such doping processes. In some embodiments, additional processing of operations 205 includes patterning over the transistor structure one or more metallization layers which are to facilitate interconnection of the transistor structure with other integrated circuitry of the same IC chip (or wafer) and/or with circuitry which is to couple to an IC chip which includes the transistor structure.

In some embodiments, method 200 may additionally or alternatively include operations to connect and/or operate an integrated circuit such as that which is produced by operations 205. For example, method 200 may comprise (at 240) coupling first circuitry to second circuitry via a transistor structure comprising the first layer and the second layer. Alternatively or in addition, method 200 may comprise (at 250) communicating a signal between the first circuitry and the second circuitry via the transistor structure.

Figure 4:
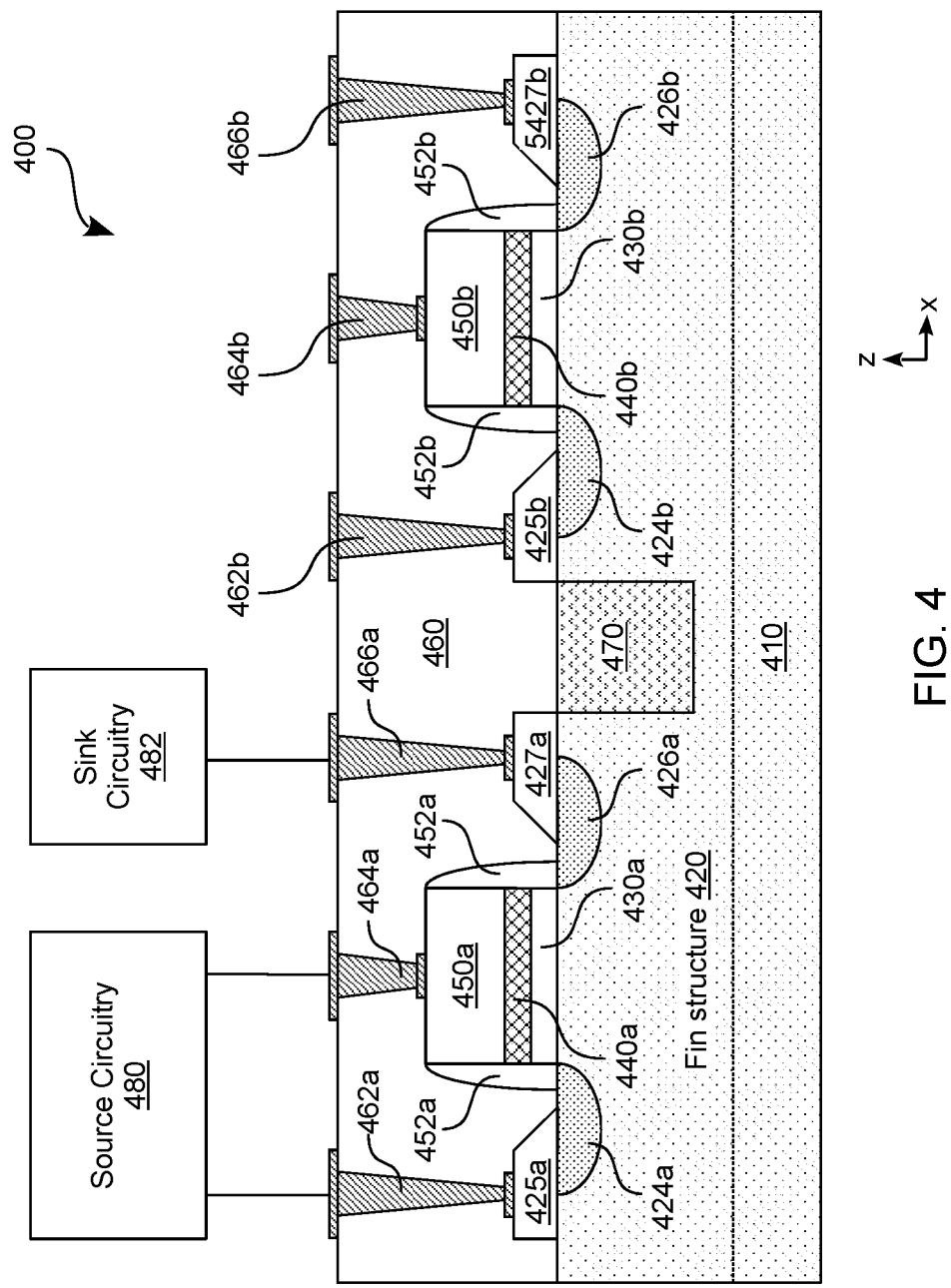
FIG. 4 shows various perspective views illustrating elements of circuitry coupled via a transistor structure according to an embodiment.

By way of illustration and not limitation, a system 500 in FIG. 4 shows one example embodiment wherein an IC chip is coupled to facilitate communication between first circuitry and second circuitry (such as the illustrative source circuitry 480 and sink circuitry 482 shown) via a transistor which comprises a gate work function silicide structure. System 400 may include some or all of the features of IC device 100, for example, and may be fabricated, coupled and/or operated according to some or all operations of method 200.

In the example embodiment shown, an IC chip of system 400 includes a substrate 410 comprising—for example—a buffer layer, silicon substrate, isolation structures and/or the like. A fin structure 420 of the IC chip may extend from a side (e.g., one of sides 112, 312) formed by substrate 410, wherein respective structures of one or more transistors are variously disposed in or on fin structure 420. For example, a first transistor of the IC chip may comprise two doped source or drain regions 424a, 426a on opposite respective side of a channel region, wherein the source or drain regions 424a, 426a and the channel region each extend to a surface of fin structure 320. Source or drain electrodes 425a, 427a may be disposed on doped source or drain regions 424a, 426a, respectively. The first transistor may further comprise a gate dielectric 430a which adjoins a surface of the channel region, and a gate work function layer 440a which extends along and adjoins a surface of gate dielectric 430a. Gate work function layer 440a comprises a silicide which, for example, may be formed by a two-part deposition process such as that illustrated by stages 301 through 304. In an embodiment, one or more other gate structures of the first transistor (such as the illustrative gate electrode 450a shown) may be stacked or otherwise disposed on gate work function layer 440a—e.g., wherein sidewall spacers 452a provide electrical insulation of gate electrode 450a and/or protection of gate electrode 450a during one or more stages of fabrication processing.

To facilitate signal communication with the first transistor, the IC die may further comprise a metallization stack 460 which includes an insulating dielectric material and patterned conductors (including traces, vias, etc.) variously extending therethrough. By way of illustration and not limitation, metallization stack 460 may comprise vias 462a, 464a, 466a which variously extend to couple (respectively) to source or drain electrode 425a, gate electrode 450a, and source or drain electrode 427a. Vias 462a, 464a, 466a may variously enable coupling with source circuitry 480 and sink circuitry 482—e.g., wherein source circuitry 480 is to provide an input signal to the first transistor, and wherein sink circuitry 482 is to receive an output signal based on the input signal. One or both of source circuitry 480 and sink circuitry 482 may be integrated with the IC chip which includes the first transistor. In some embodiments, one or each of source circuitry 480 and sink circuitry 482 is integrated with another respective IC chip which, for example, may be packaged with the IC chip comprising the first transistor. In other embodiments, one or each of source circuitry 480 and sink circuitry 482 is external to a packaged device which includes the first transistor. By way of illustration and not limitation, sink circuitry 482 may include or couple to an input/output (I/O) device—such as an antenna, touchscreen, display or the like—which is to output a signal, display an image, or otherwise provide some output based on a signal which is communicated via the first transistor. However, some embodiments are not limited to a particular functionality that may be provided by one or both of source circuitry 480 and sink circuitry 482.

Fin structure 420 (and/or one or more other fin structures of the IC chip) may further have disposed therein or thereon respective structures of one or more other transistors, some or all of which may each include a respective gate work function silicide structure. For example, a second transistor of the IC die may comprise doped source or drain regions 424b, 426b, gate dielectric 430b, gate work function layer 440b, source or drain electrode 425b, 427b, gate electrode 450b, and sidewall spacers 452b which (respectively) correspond functionally to doped source or drain regions 424b, 426b, gate dielectric 430b, gate work function layer 440b, source or drain electrode 425b, 427b, gate electrode 450b, and sidewall spacers 452b. In such an embodiment, fin structure 420 may have disposed therein a dielectric structure 470 which provides at least partial electrical insulation between the first transistor and the second transistor. Alternatively or in addition, metallization stack 460 may further comprise vias 462b, 464b, 466b which variously extend to couple (respectively) to source or drain electrode 425b, gate electrode 450b, and source or drain electrode 427b. Such coupling may facilitate signal communication between the second transistor and other circuitry.

Figure 5:
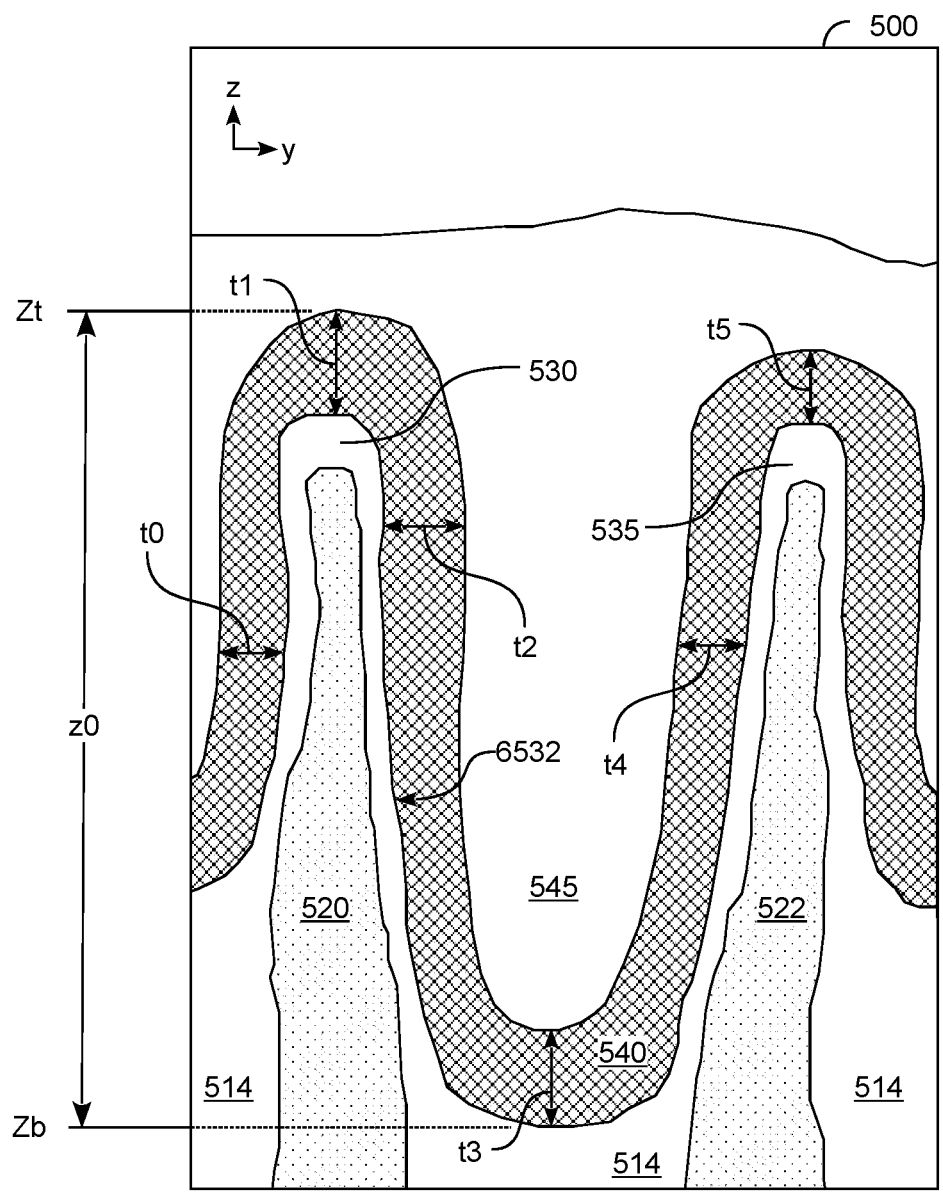
FIG. 5 is a cross-sectional view of an integrated circuit device including a silicide structure according to an embodiment.

FIG. 5 shows a cross-sectional view of an IC device 500 which includes a conformal work function silicide structure according to an embodiment. IC device 500 may include one or more structures of device 100, for example. Processing to fabricate IC device 500 may include some or all of method 200—e.g., wherein such processing forms one or more features illustrated at stages 300-305. The cross-sectional view shown in FIG. 5 corresponds to a cross-sectional plane such as the y-z plane 106 shown in FIG. 1.

As illustrated in FIG. 5, IC device 500 includes one or more fin structures—such as the illustrative fin structures 520, 522 shown—and insulation structures 514 forming one or more trenches through which the one or more fin structures variously extend. Fin structures 520, 522 and insulation structures 514 may be variously disposed over a buffer layer, semiconductor substrate and/or other structures (not shown)—e.g., wherein one or each of fin structures 520, 522 corresponds functionality to fin structure 120 and wherein insulation structures 514 correspond functionality to insulation structures 114.

In the example embodiment shown, IC device 500 comprises a multiple fin NMOS transistor structure wherein a gate structure 545 (e.g., including a gate electrode and, in some embodiments, additional layers of a gate stack) extends over and between fin structures 520, 522. However, some embodiments are not limited in this regard, and IC device 500 may additionally or alternatively include any of various other single fin or multiple fin NMOS transistor structures. A gate dielectric structure 530 extends from an underlaying portion of insulation structures 514 and over fin structure 520—e.g., wherein gate dielectric structure 530 provides electrical insulation between fin structure 520 and gate structure 545. Alternatively or in addition, a gate dielectric structure 535 may extend from an underlaying portion of insulation structure 514 and over fin structure 522. Gate dielectric structures 530, 535 may variously have one or more features of gate dielectric 130, for example.

In such an embodiment, a layer 540—comprising any of a variety of silicide materials described herein—may extend at least in part over one or more of gate dielectric structures 530, 535 and insulation structures 514. At least a portion of layer 540 may extend over, and substantially conform to, at least some curved and/or angled portion of a surface 532 formed by one or more of gate dielectric structures 530, 535 and insulation structures 514. By way of illustration and not limitation, some portion of layer 540 may have a span z0 from a local minimum height Zb to a local maximum height Zt. Span z0 (or some smaller span which is a portion of z0) may be at least three times a minimum thickness of that portion of layer 540 which extends between Zb and Zt—e.g., wherein span z0 is at least five times (and, in some embodiments, at least eight times) the minimum thickness. FIG. 5 shows various thicknesses t0 through t5 of layer 540 each at a different respective location on surface 532.

In one embodiment, the portion of layer 540 which extends between Zb and Zt has a minimum thickness which is equal to or less than 20 nm—e.g., wherein the minimum thickness is less than or equal to 10 nm (and in some embodiments, less than or equal to 7 nm). Additionally or alternatively, any variation of a minimum thickness of layer 540 from the minimum thickness may be equal to or less than one half of the minimum thickness. For example, a minimum thickness of a portion of layer 540 which extends over fin structures 520, 522 may have a minimum thickness turn, wherein, for any thickness tx of layer 540 along that portion—e.g., including any of the thicknesses t0, t1, t2, t3, t4, t5 shown—an absolute value $|(t_{min}-tx)|$ is less than or equal to the product $(0.5)(t_{min})$.

Figure 6:
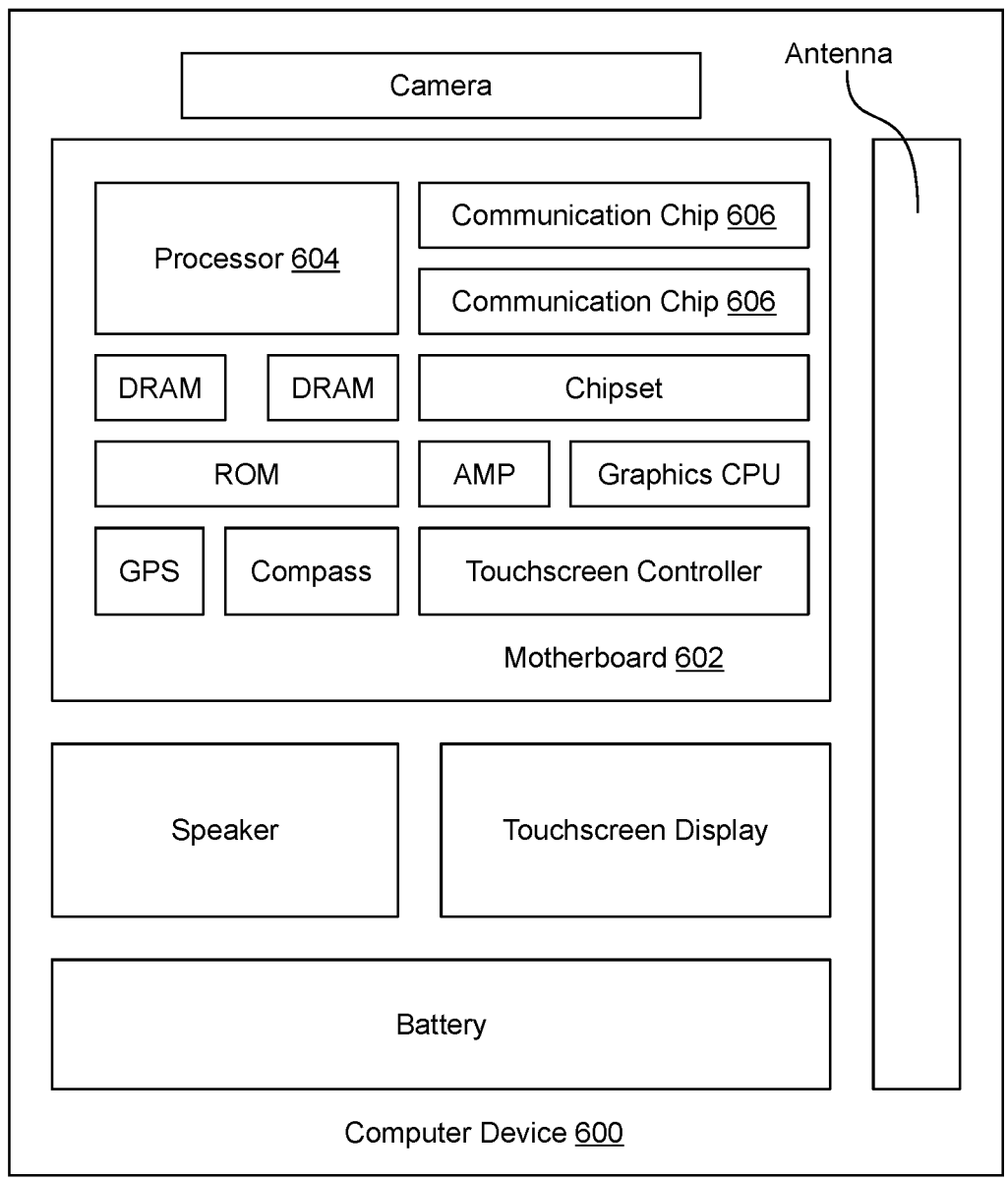
FIG. 6 is a functional block diagram illustrating a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
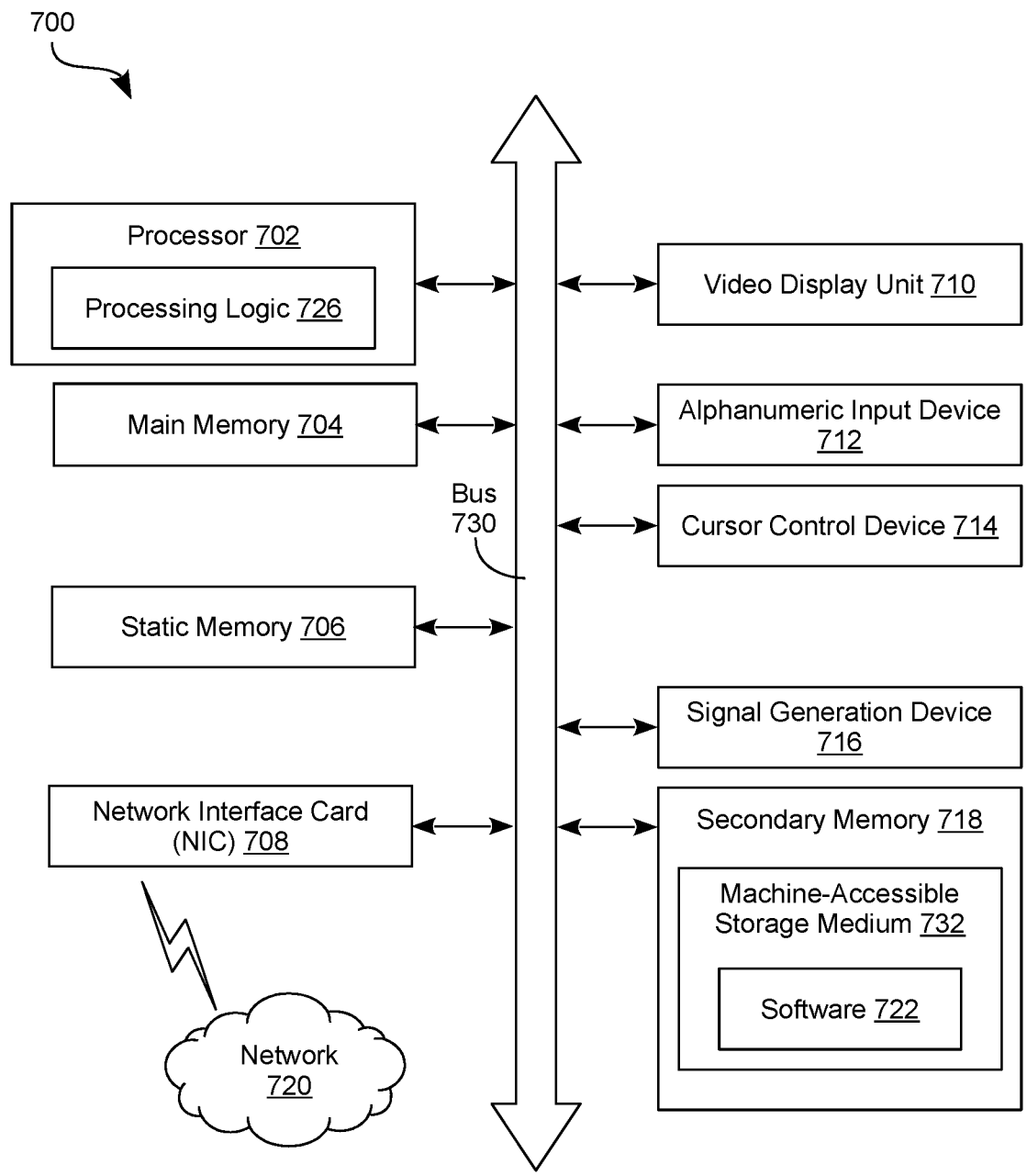
FIG. 7 is a functional block diagram illustrating an exemplary computer system, in accordance with one embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Example 1 is an integrated circuit (IC) device comprising a transistor structure comprising a channel region comprising a semiconductor, a first layer along a side of the channel region, the first layer comprising a dielectric material, and a second layer along a side of the first layer. The second layer comprises a silicide, wherein the second layer is substantially conformal to a curved or angled surface, wherein an average minimum thickness of the second layer is equal to or less than 20 nanometers (nm), and wherein a span of the second layer along a height of the curved or angled surface is greater than or equal to a distance equal to three times the average minimum thickness of the second layer.

In Example 2, the subject matter of any one or more of Examples 1 optionally includes wherein the silicide comprises silicon, one or more elements each from a respective one of Group IIIa, Group IVa, or Group Va, and at least two metals, wherein a first of the at least two metals is from Group IIIa, Group IVa, Group Va, Group IVb, Group Vb, Group VIb, Group VIIB, or Group VIIIb.

In Example 3, the subject matter of any one or more of Examples 2 optionally includes wherein the at least two metals comprises aluminum (Al), gallium (Ga), hafnium (Hf), indium (In), niobium (Nb), osmium (Os), ruthenium (Ru), tantalum (Ta), titanium (Ti), tungsten (W), yttrium (Y), or zirconium (Zr).

In Example 4, the subject matter of any one or more of Examples 2 optionally includes wherein a second of the at least two metals is from Group IIIa, Group IVa, Group Va, Group IVb, Group Vb, Group VIb, Group VIIB, or Group VIIIb.

In Example 5, the subject matter of any one or more of Examples 1 optionally includes wherein the silicide comprises silicon and a component D which comprises one or more elements each from a respective one of Group IIIa, Group IVa, or Group Va.

In Example 6, the subject matter of any one or more of Examples 5 optionally includes wherein the component D comprises one of arsenic (As), gallium (Ga), germanium (Ge), nitrogen (N), phosphorous (P), or antimony (Sb).

In Example 7, the subject matter of any one or more of Examples 5 optionally includes wherein the silicide further comprises a component M which comprises one or more transition metal elements each from a respective one of Group IVb, Group Vb, Group VIb, Group VIIB, or Group VIIIb, or one or more metal elements each from a respective one of Groups IIIa, Group IVa, or Group Va.

In Example 8, the subject matter of any one or more of Examples 7 optionally includes wherein the component M comprises aluminum (Al), gallium (Ga), hafnium (Hf), indium (In), niobium (Nb), osmium (Os), ruthenium (Ru), tantalum (Ta), titanium (Ti), tungsten (W), yttrium (Y), or zirconium (Zr).

In Example 9, the subject matter of any one or more of Examples 1 optionally includes wherein the silicide comprises silicon and a component M which comprises one or more transition metal elements each from a respective one of Group IVb, Group Vb, Group VIb, Group VIIB, or Group VIIIb, or one or more metal elements each from a respective one of Groups IIIa, Group IVa, or Group Va.

In Example 10, the subject matter of any one or more of Examples 9 optionally includes wherein the component M comprises metals M1, M2 each of a different respective metal type.

In Example 11, the subject matter of any one or more of Examples 9 optionally includes wherein the component M comprises aluminum (Al), hafnium (Hf), tantalum (Ta), titanium (Ti), or tungsten (W).

In Example 12, the subject matter of any one or more of Examples 1, 2, 5, and 9 optionally includes wherein the IC device comprises a fin structure comprising the channel region which extends, along a length of the fin structure, between a source region of the transistor structure and a drain region of the transistor structure, wherein a perimeter of the second layer forms an edge structure which extends in parallel with the length of the fin structure.

In Example 13, the subject matter of any one or more of Examples 12 optionally includes wherein a height of the edge structure is greater than a height of any portion of the second layer which is on the fin structure or along a sidewall of the fin structure.

Example 14 is a method for fabricating a transistor structure, the method comprising forming a channel region comprising a semiconductor, depositing over the channel region a first layer comprising a dielectric material, and forming on the first layer a second layer comprising a silicide, wherein the second layer is substantially conformal to a curved or angled surface. An average minimum thickness of the second layer is equal to or less than 20 nanometers (nm), wherein a span of the second layer along a height of the curved or angled surface is greater than or equal to a distance equal to three times the average minimum thickness of the second layer.

In Example 15, the subject matter of any one or more of Examples 14 optionally includes wherein forming the second layer comprises depositing a first material on the first layer, after depositing the first material, depositing a second material on a portion of the first material, and reacting the portion of the first material with a portion of the second material to form the silicide.

In Example 16, the subject matter of any one or more of Examples 15 optionally includes wherein forming the second layer comprises etching away another portion of the first material prior to depositing the second material.

In Example 17, the subject matter of any one or more of Examples 15 optionally includes wherein one of the first material and the second material includes a component M which comprises one or more metal elements, and wherein the other of the first material and the second material includes both silicon and component D which comprises one or more elements each from a respective one of Group IIIa, Group IVa, or Group Va.

In Example 18, the subject matter of any one or more of Examples 14 optionally includes wherein the silicide comprises silicon, one or more elements each from a respective one of Group IIIa, Group IVa, or Group Va, and at least two metals, wherein a first of the at least two metals is from Group IIIa, Group IVa, Group Va, Group IVb, Group Vb, Group VIb, Group VIIB, or Group VIIIb.

In Example 19, the subject matter of any one or more of Examples 18 optionally includes wherein the at least two metals comprises aluminum (Al), gallium (Ga), hafnium (Hf), indium (In), niobium (Nb), osmium (Os), ruthenium (Ru), tantalum (Ta), titanium (Ti), tungsten (W), yttrium (Y), or zirconium (Zr).

In Example 20, the subject matter of any one or more of Examples 18 optionally includes wherein a second of the at least two metals is from Group IIIa, Group IVa, Group Va, Group IVb, Group Vb, Group VIb, Group VIIB, or Group VIIIb.

In Example 21, the subject matter of any one or more of Examples 14 optionally includes wherein the silicide comprises silicon and a component D which comprises one or more elements each from a respective one of Group IIIa, Group IVa, or Group Va.

In Example 22, the subject matter of any one or more of Examples 21 optionally includes wherein the component D comprises one of arsenic (As), gallium (Ga), germanium (Ge), nitrogen (N), phosphorous (P), or antimony (Sb).

In Example 23, the subject matter of any one or more of Examples 21 optionally includes wherein the silicide further comprises a component M which comprises one or more transition metal elements each from a respective one of Group IVb, Group Vb, Group VIb, Group VIIB, or Group VIIIb, or one or more metal elements each from a respective one of Groups IIIa, Group IVa, or Group Va.

In Example 24, the subject matter of any one or more of Examples 23 optionally includes wherein the component M comprises aluminum (Al), gallium (Ga), hafnium (Hf), indium (In), niobium (Nb), osmium (Os), ruthenium (Ru), tantalum (Ta), titanium (Ti), tungsten (W), yttrium (Y), or zirconium (Zr).

In Example 25, the subject matter of any one or more of Examples 14 optionally includes wherein the silicide comprises silicon and a component M which comprises one or more transition metal elements each from a respective one of Group IVb, Group Vb, Group VIb, Group VIIB, or Group VIIIb, or one or more metal elements each from a respective one of Groups IIIa, Group IVa, or Group Va.

In Example 26, the subject matter of any one or more of Examples 25 optionally includes wherein the component M comprises metals M1, M2 each of a different respective metal type.

In Example 27, the subject matter of any one or more of Examples 25 optionally includes wherein the component M comprises aluminum (Al), hafnium (Hf), tantalum (Ta), titanium (Ti), or tungsten (W).

In Example 28, the subject matter of any one or more of Examples 14, 15, 18, 21 and 25 optionally includes wherein forming the channel region comprises forming a fin structure, wherein the channel region extends, along a length of the fin structure, between a source region of the transistor structure and a drain region of the transistor structure, and wherein, after forming the second layer, a perimeter of the second layer forms an edge structure which extends in parallel with the length of the fin structure.

In Example 29, the subject matter of any one or more of Examples 28 optionally includes wherein a height of the edge structure is greater than a height of any portion of the second layer which is on the fin structure or along a sidewall of the fin structure.

Example 30 is a system comprising an integrated circuit (IC) device comprising a transistor structure comprising a channel region comprising a semiconductor, a first layer along a side of the channel region, the first layer comprising a dielectric material, and a second layer along a side of the first layer, the second layer comprising a silicide, wherein the second layer is substantially conformal to a curved or angled surface. An average minimum thickness of the second layer is equal to or less than 20 nanometers (nm), wherein a span of the second layer along a height of the curved or angled surface is greater than or equal to a distance equal to three times the average minimum thickness of the second layer. The system further comprises a display device coupled to the IC device, the display device to display an image based on the signal.

In Example 31, the subject matter of any one or more of Examples 30 optionally includes wherein the silicide comprises silicon, one or more elements each from a respective one of Group IIIa, Group IVa, or Group Va, and at least two metals, wherein a first of the at least two metals is from Group IIIa, Group IVa, Group Va, Group IVb, Group Vb, Group VIb, Group VIIB, or Group VIIIb.

In Example 32, the subject matter of any one or more of Examples 31 optionally includes wherein the at least two metals comprises aluminum (Al), gallium (Ga), hafnium (Hf), indium (In), niobium (Nb), osmium (Os), ruthenium (Ru), tantalum (Ta), titanium (Ti), tungsten (W), yttrium (Y), or zirconium (Zr).

In Example 33, the subject matter of any one or more of Examples 31 optionally includes wherein a second of the at least two metals is from Group IIIa, Group IVa, Group Va, Group IVb, Group Vb, Group VIb, Group VIIB, or Group VIIIb.

In Example 34, the subject matter of any one or more of Examples 30 optionally includes wherein the silicide comprises silicon and a component D which comprises one or more elements each from a respective one of Group IIIa, Group IVa, or Group Va.

In Example 35, the subject matter of any one or more of Examples 34 optionally includes wherein the component D comprises one of arsenic (As), gallium (Ga), germanium (Ge), nitrogen (N), phosphorous (P), or antimony (Sb).

In Example 36, the subject matter of any one or more of Examples 34 optionally includes wherein the silicide further comprises a component M which comprises one or more transition metal elements each from a respective one of Group IVb, Group Vb, Group VIb, Group VIIB, or Group VIIIb, or one or more metal elements each from a respective one of Groups IIIa, Group IVa, or Group Va.

In Example 37, the subject matter of any one or more of Examples 36 optionally includes wherein the component M comprises aluminum (Al), gallium (Ga), hafnium (Hf), indium (In), niobium (Nb), osmium (Os), ruthenium (Ru), tantalum (Ta), titanium (Ti), tungsten (W), yttrium (Y), or zirconium (Zr).

In Example 38, the subject matter of any one or more of Examples 30 optionally includes wherein the silicide comprises silicon and a component M which comprises one or more transition metal elements each from a respective one of Group IVb, Group Vb, Group VIb, Group VIIB, or Group VIIIb, or one or more metal elements each from a respective one of Groups IIIa, Group IVa, or Group Va.

In Example 39, the subject matter of any one or more of Examples 38 optionally includes wherein the component M comprises metals M1, M2 each of a different respective metal type.

In Example 40, the subject matter of any one or more of Examples 38 optionally includes wherein the component M comprises aluminum (Al), hafnium (Hf), tantalum (Ta), titanium (Ti), or tungsten (W).

In Example 41, the subject matter of any one or more of Examples 30, 31, 34, and 38 optionally includes wherein the IC device comprises a fin structure comprising the channel region which extends, along a length of the fin structure, between a source region of the transistor structure and a drain region of the transistor structure, wherein a perimeter of the second layer forms an edge structure which extends in parallel with the length of the fin structure.

In Example 42, the subject matter of any one or more of Examples 41 optionally includes wherein a height of the edge structure is greater than a height of any portion of the second layer which is on the fin structure or along a sidewall of the fin structure.

Techniques and architectures for providing transistor functionality of an integrated circuit are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:
1. An integrated circuit (IC) device comprising:
a substrate;
a fin structure extending in a first direction from the substrate, wherein the fin structure comprises a channel region of a transistor structure, the channel region comprising a semiconductor;
a sidewall structure which extends in the first direction from the substrate;
a first layer which extends in the first direction along a side of the fin structure, and which adjoins the channel region, the first layer comprising a dielectric material; and
a second layer which extends along and adjoins a side of the first layer, the second layer comprising a silicide, wherein the second layer further extends across a recess region to each of the sidewall structure and the side of the first layer, and further extends along a portion of the sidewall structure, wherein a maximum vertical extent of the second layer along the sidewall structure is less than a maximum vertical extent of the sidewall structure, and is more than a maximum vertical extent of the second layer over the fin structure, wherein the second layer is substantially conformal to a curved or angled surface, wherein an average minimum thickness of the second layer is equal to or less than 20 nanometers (nm), and wherein a span of the second layer along a height of the curved or angled surface is greater than or equal to a distance equal to three times the average minimum thickness of the second layer.

2. The IC device of claim 1, wherein the silicide comprises:
   silicon;
   one or more elements each from a respective one of Group Ma, Group IVa, or Group Va; and
   at least two metals, wherein a first of the at least two metals is from Group Ma, Group IVa, Group Va, Group IVb, Group Vb, Group VIb, Group VIIB, or Group VIIIb.

3. The IC device of claim 2, wherein the at least two metals comprises aluminum (Al), gallium (Ga), hafnium (Hf), indium (In), niobium (Nb), osmium (Os), ruthenium (Ru), tantalum (Ta), titanium (Ti), tungsten (W), yttrium (Y), or zirconium (Zr).

4. The IC device of claim 2, wherein a second of the at least two metals is from Group Ma, Group IVa, Group Va, Group IVb, Group Vb, Group VIb, Group VIIB, or Group VIIIb.

5. The IC device of claim 1, wherein the silicide comprises silicon and a component M which comprises:
   one or more transition metal elements each from a respective one of Group IVb, Group Vb, Group VIb, Group VIIB, or Group VIIIb; or
   one or more metal elements each from a respective one of Groups Ma, Group IVa, or Group Va.

6. The IC device of claim 5, wherein the component M comprises metals M1 and M2 each of a different respective metal type.

7. The IC device of claim 5, wherein the component M comprises aluminum (Al), hafnium (Hf), tantalum (Ta), titanium (Ti), or tungsten (W).

8. The IC device of claim 1, wherein the channel region extends, along a length of the fin structure, between a source region of the transistor structure and a drain region of the transistor structure, wherein a perimeter of the second layer forms an edge structure which extends in parallel with the length of the fin structure.

9. A system comprising:
   an integrated circuit (IC) device comprising:
      a substrate;
      a fin structure extending in a first direction from the substrate, wherein the fin structure comprises a channel region of a transistor structure, the channel region comprising a semiconductor;
      a sidewall structure which extends in the first direction from the substrate;
      a first layer which extends in the first direction along a side of the fin structure, and which adjoins the channel region, the first layer comprising a dielectric material; and
      a second layer which extends along and adjoins a side of the first layer, the second layer comprising a silicide, wherein the second layer further extends across a recess region to each of the sidewall structure and the side of the first layer, and further extends along a portion of the sidewall structure, wherein a maximum vertical extent of the second layer along the sidewall structure is less than a maximum vertical extent of the sidewall structure, and is more than a maximum vertical extent of the second layer over the fin structure, wherein the second layer is substantially conformal to a curved or angled surface, wherein an average minimum thickness of the second layer is equal to or less than 20 nanometers (nm), and wherein a span of the second layer along a height of the curved or angled surface is greater than or equal to a distance equal to three times the average minimum thickness of the second layer; and
   a display device coupled to the IC device, the display device to display an image based on the signal.

10. The system of claim 9, wherein the silicide comprises:
    silicon;
    one or more elements each from a respective one of Group Ma, Group IVa, or Group Va; and
    at least two metals, wherein a first of the at least two metals is from Group Ma, Group IVa, Group Va, Group IVb, Group Vb, Group VIb, Group VIIB, or Group VIIIb.

11. The system of claim 10, wherein the at least two metals comprises aluminum (Al), gallium (Ga), hafnium (Hf), indium (In), niobium (Nb), osmium (Os), ruthenium (Ru), tantalum (Ta), titanium (Ti), tungsten (W), yttrium (Y), or zirconium (Zr).

12. The system of claim 9, wherein the silicide comprises silicon and a component M which comprises:
    one or more transition metal elements each from a respective one of Group IVb, Group Vb, Group VIb, Group VIIB, or Group VIIIb; or
    one or more metal elements each from a respective one of Groups Ma, Group IVa, or Group Va.

13. The system of claim 12, wherein the component M comprises metals M1 and M2 each of a different respective metal type.

* * * * *